United States Patent
Kohli et al.

(10) Patent No.: US 7,560,379 B2
(45) Date of Patent: Jul. 14, 2009

(54) SEMICONDUCTIVE DEVICE FABRICATED USING A RAISED LAYER TO SILICIDE THE GATE

(75) Inventors: Puneet Kohli, Austin, TX (US); Manfred B. Ramin, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 240 days.

(21) Appl. No.: 11/348,835

(22) Filed: Feb. 7, 2006

(65) Prior Publication Data

US 2007/0184572 A1      Aug. 9, 2007

(51) Int. Cl.
H01L 21/4763    (2006.01)
H01L 21/28      (2006.01)
H01L 21/44      (2006.01)

(52) U.S. Cl. .................. 438/630; 438/300; 438/583; 438/664; 438/721; 438/722; 257/E21.165; 257/E21.438; 257/E21.619

(58) Field of Classification Search .......... 438/300, 438/630, 664, 721, 722; 257/E21.438, E21.165, 257/E21.619
See application file for complete search history.

(56) References Cited

U.S. PATENT DOCUMENTS

| | | | | |
|---|---|---|---|---|
| 4,486,266 A | * | 12/1984 | Yamaguchi | 438/222 |
| 5,322,809 A | * | 6/1994 | Moslehi | 438/303 |
| 5,691,212 A | * | 11/1997 | Tsai et al. | 438/297 |
| 6,180,464 B1 | * | 1/2001 | Krivokapic et al. | 438/289 |
| 6,221,760 B1 | * | 4/2001 | Hamada | 438/630 |
| 6,632,740 B1 | * | 10/2003 | Bertrand et al. | 438/682 |
| 6,905,922 B2 | * | 6/2005 | Lin et al. | 438/199 |
| 7,244,642 B2 | * | 7/2007 | Vitale et al. | 438/197 |
| 2004/0209432 A1 | * | 10/2004 | Ku et al. | 438/301 |
| 2005/0118805 A1 | * | 6/2005 | Nishihara et al. | 438/682 |
| 2006/0022266 A1 | * | 2/2006 | Messenger et al. | 257/347 |

* cited by examiner

Primary Examiner—Walter L Lindsay, Jr.
Assistant Examiner—Mohsen Ahmadi
(74) Attorney, Agent, or Firm—Warren L. Franz; Wade J. Brady, III; Frederick J. Telecky, Jr.

(57) ABSTRACT

In one aspect, the invention provides a method of fabricating a semiconductive device 200 that comprises forming a raised layer [510] adjacent a gate [340] and over a source/drain [415], depositing a silicidation layer [915] over the gate [340] and the raised layer [510], and moving at least a portion of the silicidation layer [915] into the source/drain [415] through the raised layer [510].

18 Claims, 7 Drawing Sheets

SEMICONDUCTIVE DEVICE FABRICATED USING A RAISED LAYER TO SILICIDE THE GATE

TECHNICAL FIELD OF THE INVENTION

The invention is directed in general to a semiconductive device, and more specifically, to a semiconductive device fabricated using a raised layer to substantially silicide a gate.

BACKGROUND

Metal gate electrodes are currently being investigated to replace polysilicon gate electrodes in today's ever shrinking and changing transistor devices. One of the principal reasons the industry is investigating replacing the polysilicon gate electrodes with metal gate electrodes is to solve problems of poly-depletion effects and boron penetration for future CMOS devices and to get desirable threshold voltages. Traditionally, a polysilicon gate electrode with an overlying silicide was used for the gate electrodes in CMOS devices. However, as device feature sizes continue to shrink, poly depletion and gate sheet resistance become serious issues when using polysilicon gate electrodes. Accordingly, metal silicided gates have been proposed. In this approach, polysilicon is deposited over the gate. A metal is deposited over the polysilicon and reacted to completely consume the polysilicon, resulting in a fully silicided metal gate, rather than a deposited metal gate.

Complications can arise, however, during the silicidation of the gate electrodes. For example, in some conventional processes, where the gate is silicided before the source/drains are activated, the gates suffer from potential work function drift because of potential degradation of the gate dielectric/gate interface upon exposure to high thermal budgets (e.g., those in excess of 900° C.) that are required to activate the source/drains. When the gate is silicided before the source/drain activation, the high activation temperatures can drive the silicide through the gate dielectric and into the channel region.

To overcome these problems, other processes, where the gate electrodes are silicided after the activation of the source/drain, have been developed. In one such process, two different silicidation steps are performed, with a thicker metal being deposited for the gate electrode and a thinner metal being deposited for the silicidation of the source/drains. Though these processes address the problems associated with those processes where the gate is silicided before the source/drain activation, they require several different process steps. These steps include separately masking the source/drains and the gate electrode to protect them during their respective silicidation processes and using expensive chemical/mechanical polishing processes to remove the masks. These steps not only add cost and time to the manufacturing process, but they do not fully address all of the above-mentioned problems.

Additionally, in other processes, the source/drains are silicided before the gate electrodes. Given the difference in the thickness of the gate electrode and the source/drain junction depth, the silicide in the source/drains is driven deeper to the point of penetrating the source/drain junction during the silicidation of the gate. This can render the device inoperable, or cause shorts or spikes in the device.

Accordingly, what is needed in the art is a silicidation process that avoids the deficiencies of the conventional processes discussed above.

SUMMARY OF INVENTION

To overcome the deficiencies in the prior art, the invention, in one embodiment, provides a method of fabricating a semiconductive device that comprises forming a raised layer adjacent a gate and over a source/drain, depositing a silicidation layer over the gate and the raised layer, and siliciding the raised layer and substantially siliciding the gate with the silicidation layer.

In another embodiment, the invention provides a method of manufacturing a semiconductive device, comprising forming gates with a hardmask located thereover. The gate and the hardmasks are located over a semiconductive substrate. The method further includes forming source/drains adjacent the gates, forming a raised layer adjacent the gates and over the source/drains, removing the hardmask from each of the gates, depositing a silicidation layer over the gates and the raised layer, and siliciding the raised layer and substantially siliciding the gate with the silicidation layer.

BRIEF DESCRIPTION OF THE DRAWINGS

Reference is now made to the following description taken in conjunction with the accompanying drawings, in which.

DETAILED DESCRIPTION

Figure 1:
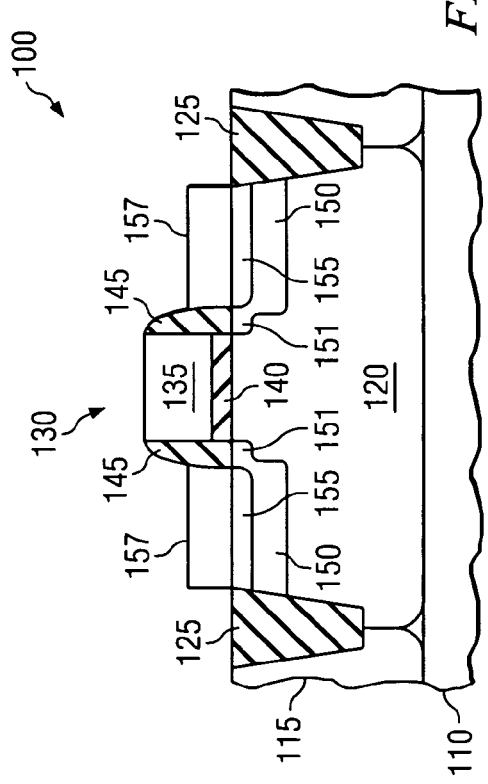
FIG. 1 illustrates a sectional view of one embodiment of a semiconductive device provided by the invention.

FIG. 1 is one embodiment of a semiconductive device 100 of the invention. The semiconductive device 100 may comprise a conventional semiconductive substrate 110, such as a wafer. An active region 115, which may also be conventional, is located over the substrate 110, and includes a well 120. The well 120 may be of conventional design and is typically located adjacent another well that is similarly or complementary doped. Isolation structures 125, such as conventional shallow trenches, are also located in the active region 115 and electrically isolate adjacent wells 120. The isolation structures 125 may be filled with a conventional dielectric material, such as a high density plasma oxide.

The semiconductive device 100 further includes a transistor 130 that includes a gate 135, a gate oxide 140, spacers 145, source/drains 150 and suicide contacts 155 located over the source/drains 150, all of which may be constructed with conventional materials and by conventional processes. The source/drains 150 may include extensions 151 that are formed by lightly doped drains (LDDs), and together, they form a junction profile as understood by those skilled in the art. Thus, the depth of the profile will vary. Also included is a silicided raised layer 157 that is located over the source/drains 150. Because of the way in which the silicide contacts 155 are formed, the gate 135 can be fully silicided without causing junction penetration by the silicide within the source/drain, thereby avoiding the above-mentioned problems. One method that may be used to manufacture the semiconductive device 100 is discussed below.

Figure 2:
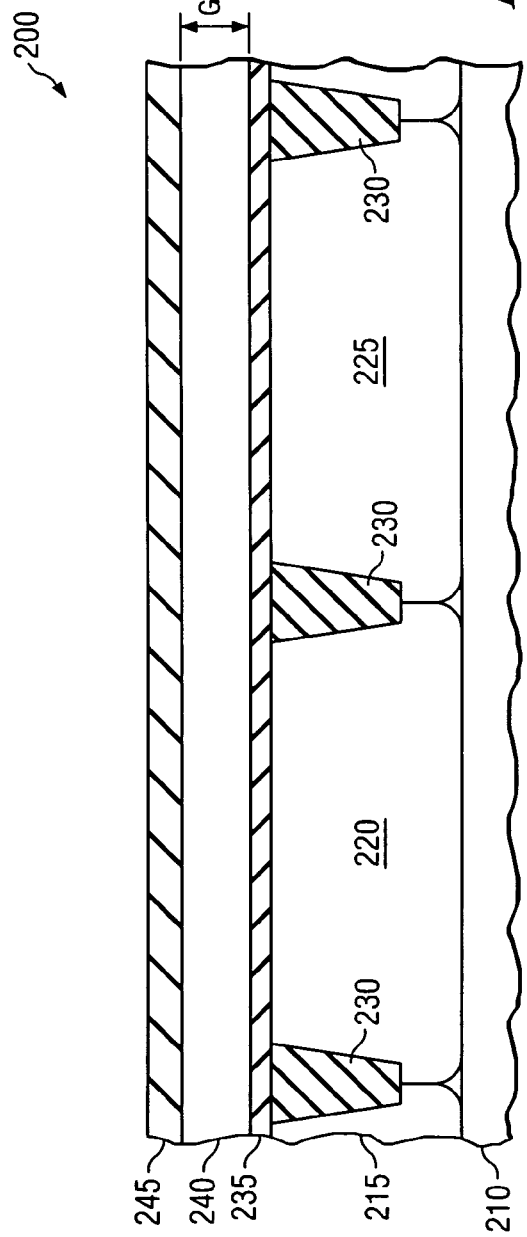
FIG. 2 illustrates a sectional view of the semiconductive device at an early stage of manufacture.

FIG. 2 shows the semiconductive device 100 of FIG. 1 at an early stage of manufacture. The semiconductive device 200 includes a semiconductive substrate 210, such as silicon, silicon-germanium, or gallium arsenide, over which is located an active layer 215. The active layer 215 may be a portion of the substrate 210 that is appropriately doped, or it may be a conventionally doped epitaxial layer. Wells 220 and 225 may be formed within the active layer 215 and are electrically isolated by isolation structures 230. The wells 220 and 225 may be similarly doped with conventional p-type or n-type dopants, or they may be oppositely doped to a complementary configuration. A high quality gate oxide layer 235 is located over the active layer 215. A gate layer 240, such as a polysilicon layer, and a hardmask layer 245, such as silicon nitride or an oxide, are located over the gate oxide layer 235. The gate layer 240 may be doped with a dopant, such as boron, phosphorous, arsenic or another similar dopant, depending on whether the semiconductive device 200 is operating as a PMOS device or an NMOS device. In one embodiment, the gate layer 240 may be doped or modified to configure it to the minimum energy required to bring an electron from the Fermi level to the vacuum level or further adjust its work function. The gate layer 240 may be doped prior to the deposition of the hardmask layer 245 or at the same time that the source/drains are doped. One who is skilled in the art will understand that various integration schemes can be used to form the source/drains. The thickness of the gate layer 240 may vary, depending on design. The thickness of the hardmask layer 245 will also vary, but in most embodiments, it should be thick enough to adequately protect the gate layer 240 during subsequent process steps.

Figure 3:
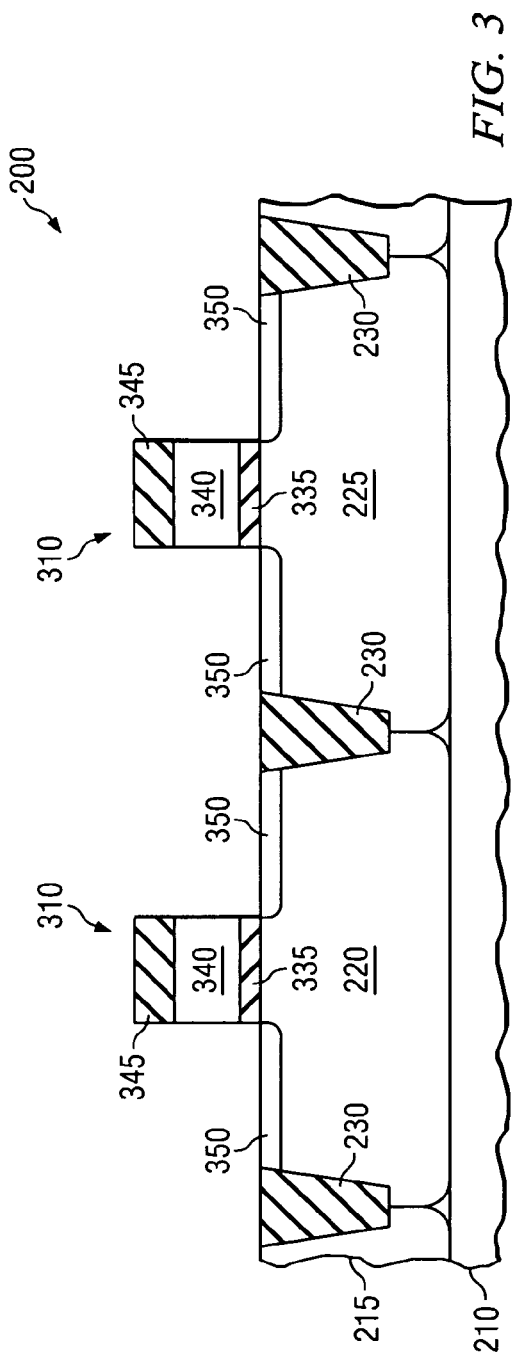
FIG. 3 illustrates a sectional view of the semiconductive device of FIG. 2 following gate patterning.

In FIG. 3, the layers 235, 240 and 245 have been conventionally patterned to form gate electrodes 310 that include gate oxides 335, gates 340 and hardmasks 345. The semiconductive device 200 further includes LDDs 350 that may be conventionally formed. In other embodiments, however, the LDDs 350 may not be present.

Figure 4:
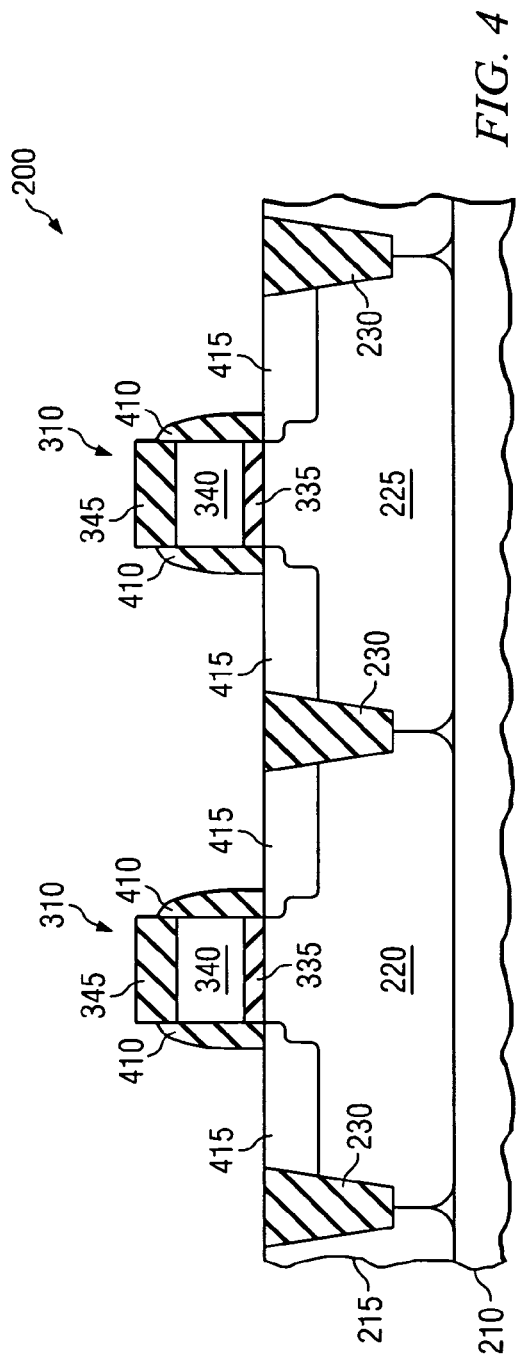
FIG. 4 illustrates a sectional view of the semiconductive device of FIG. 3 following source/drain formation.

FIG. 4 illustrates the semiconductive device 200 of FIG. 3 after the formation of spacers 410. The spacers 410 may also be formed with conventional processes and be comprised of a single deposited material, such as oxide, or it may have a multi-layered configuration. For example, the spacers 410 may be a combination of oxide, nitride, and oxide. Deep source/drains 415 may be formed after the formation of the spacers 410 and, in an alternative embodiment, the formation of the deep source/drains 415 may be deferred until after the formation of a raised layer, which is discussed below. The source/drains 415 may be conventionally formed. The spacers 410 offset the source/drains 415 from the gates 340 by the desired distance. The source/drains 415 are appropriately doped to form a PMOS, NMOS, CMOS device, or combinations thereof.

Figure 5:
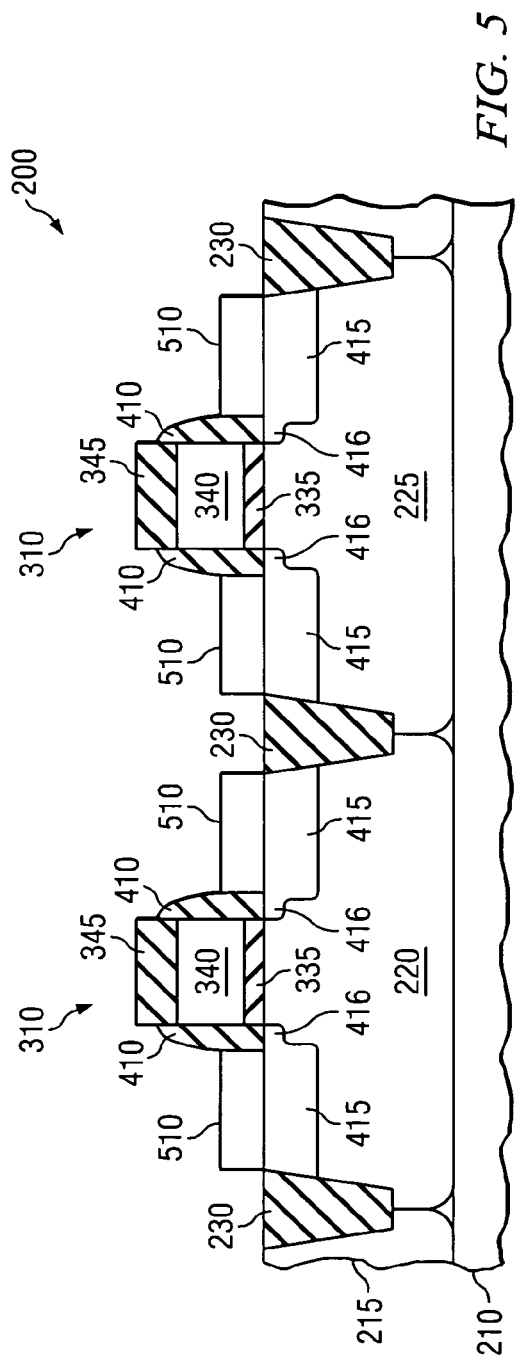
FIG. 5 illustrates a sectional view of the semiconductive device of FIG. 4 following deposition of the raised layer.

FIG. 5 shows the semiconductive device 200 of FIG. 4 after the formation of a raised layer 510 over the source/drains 415. In an alternative embodiment, the deep source/drains 415 may be formed after the formation of the raised layer 510. The raised layer 510 may be formed using conventional processes and, in one embodiment, the layer 510 may be an epitaxial layer. The raised layer 510 may be achieved from well-known solid-phase, liquid-phase, vapor-phase or molecular beam deposition processes. One example of a deposition process involves the use of chemical vapor deposition to form the raised layer 510. Non-limiting examples of materials that can be used to form the raised layer 510 include silicon tetrachloride, trichlorosilane, dichlorosilane, silane, silicon, germanium, arsenide, or various combinations of these materials.

The deposition temperatures may range from about 500° C. to about 1000° C. at pressures of approximately 80 Torr. In other embodiments, the deposition parameters will vary from those just stated above, depending on the materials and the deposition process used to form raised layer 510. Those who are skilled in the art would understand how to conduct these deposition processes.

One purpose of the raised layer 510 is to serve as an offset for the silicidation of the gates 340 so that the gates 340 can be substantially silicided without penetrating the source/drain 415 junction. This holds true, even at the source/drains' shallowest points, which includes the source/drains' 415 extensions that are formed by the above-mentioned LDDs. In certain embodiments, the raised layer 510 will have a thickness that is less than the thickness of the gates 340. For example, in those embodiments where the gates' 340 thicknesses are 80 nm, the raised layers' 510 thicknesses will be from about 20 nm to 40 nm less.

In another embodiment, the raised layer 510 may also function as a raised source/drain or as part of the source/drain 415. For example, the raised layer 510 may be appropriately doped, as indicated. Of course, in those embodiments where it does not serve as the source/drain, the raised layer 510 will remain undoped. If the formation of the source/drains 415 has been deferred, then dopants are diffused through the raised layer 510 and into the active layer 215 to form the source/drains 415. Conventional processes may be used to accomplish this.

The hardmasks 345 protect the gates 340 and prevent the formation of the raised layer 510 directly on the gates 340. The raised layer 510 is, however, able to form on the unprotected silicon located adjacent the gates 340, which promotes the formation of the raised layer 510 over the source/drains 415.

The thickness of the raised layer 510 will vary depending on the diffusion rate of the material that will be used to silicide the gates 340 and the source/drains 415, the temperatures, and other process parameters being used for the silicidation process. For example, the thickness of the layer 510 may depend on or be a function of the thickness of the gates 340. In such embodiments, the layers' 510 thicknesses should be sufficient to prevent the silicidation from penetrating the shallowest depth of the source/drain 415 junction, including any extension regions 416 adjacent the inner edge of the spacer 410, during the silicidation of the gates 340, and thereby avoid the above-mentioned problems. By way of example only, the silicide should not penetrate greater than 20 nm into the source/drain for 90 nm node technologies. In other embodiments, these depths will vary depending on the size of the node. Typically, the thickness of the gates 340 will be about 20 nm to 40 nm thicker than the deepest junction point of the source/drain 415. Again, these thicknesses are stated for illustrative purposes only, and they will vary depending on the size of the technology involved. In other embodiments, however, the gates' 340 thicknesses may be less than the deepest junction point of the source/drains 415. In such embodiments, the thickness of the raised layer 510 will be adjusted accordingly.

Figure 6:
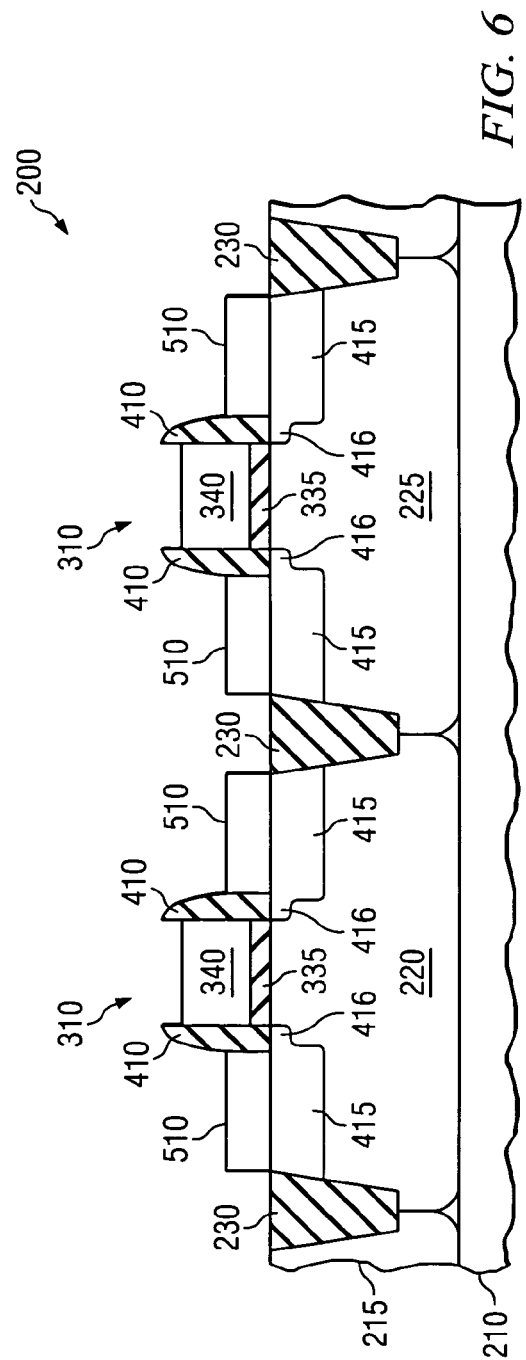
FIG. 6 illustrates a sectional view of the semiconductive device of FIG. 5 following removal of the hardmask.

With the formation of the raised layer 510 complete, the hardmasks 345 may be conventionally removed, as shown in FIG. 6. The removal of the hardmasks 345 exposes the upper surface of the gates 340 for silicidation.

Figure 7:
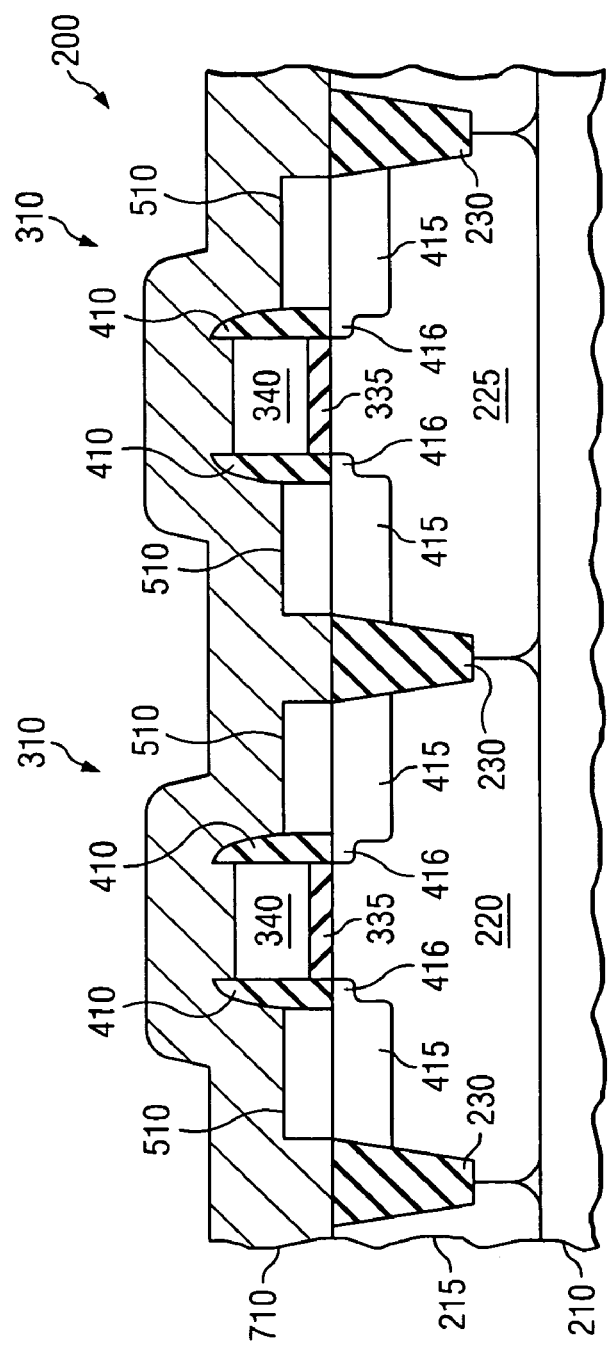
FIG. 7 illustrates a sectional view of the semiconductive device of FIG. 6 following deposition of the silicidation layer.

FIG. 7 is the semiconductive device 200 of FIG. 6 following the deposition of a silicidation layer 710. The silicidation layer 710 is a layer that is used to silicide an underlying layer, and it may be deposited using conventional deposition processes. The silicidation layer 710 may be any conventional metal, metal alloy or other material that can be used to silicide the gates 340. The silicidation layer 710 is used to further adjust or tune the work function of the gates 340, and the type of material used will depend on the desired work function. Non-limiting examples of the types of materials that can be used to silicide the gates 340 include nickel, cobalt, platinum, tungsten, or various combinations and alloys of these metals.

As mentioned above, the thickness of the silicidation layer 710 will also vary and depend to some extent on the metal used, the thickness of the gates 340, the configuration of the source/drains 415 junctions, and the silicidation parameters that are used. For example, in one embodiment, the thickness of the gates 340 may be about 80 nm, while the thickness of the silicidation layer 710 will be about 60 nm.

In those embodiments where the silicidation layer 710 is nickel, an exemplary silicide process comprises placing a blanket of nickel over the semiconductive device 200. As it takes approximately 1 nm of nickel to fully or substantially silicide approximately 1.8 nm of polysilicon, the thickness of the blanket layer of nickel should be at least about 56% of the thickness of the gates 340. To be comfortable, however, it is suggested that the thickness of the layer of nickel should be about at least 60% of the thickness of the gates 340. Thus, where the thickness of the gates 340 ranges from about 50nm to about 150 nm, the thickness of the blanket layer of nickel should range from approximately 30 nm to about 90 nm. In another embodiment, if the PMOS is realized with metal rich silicide, the nickel may be about 1.15 times the gate poly thickness.

Figure 8:
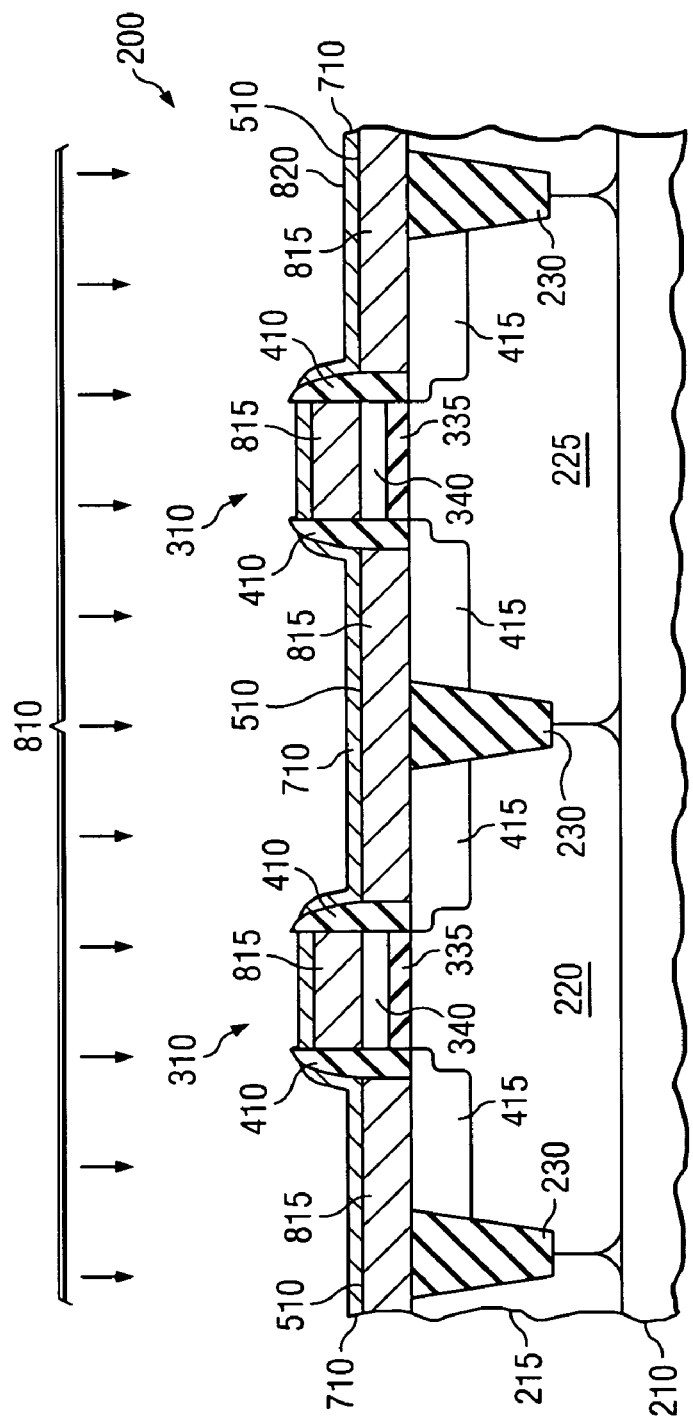
FIG. 8 illustrates a sectional view of the semiconductive device of FIG. 7 following an anneal.

Following the deposition of the silicidation layer 710, the semiconductive device 200 in FIG. 8 is subjected to a thermal anneal 810 at a temperature that ranges from about 300° C. to about 450° C. and for a period of time ranging from about 30 seconds to about 60 seconds in those embodiments where the silicidation layer 710 is nickel. It should be noted, however, that the silicidation process may vary depending on the amount of silicidation that is desired and the materials that are used to silicide the gates 340. For example, if the gates 340 are silicided with a combination of cobalt, titanium, platinum, or erbium then the silicidation process parameters and percentages of materials used will be different than those just stated above. Those who are skilled in the art will understand how to achieve the desired degree of silicidation in these instances.

In one embodiment, anneal 810 forms a metal rich phase 815 located in an upper portion of the gates 340 and in the raised layer 510, as illustrated in FIG. 8. FIG. 8 also shows how the silicidation layer 710 has been partially driven into the gate 340 and substantially through the raised layer 510. Depending on the initial thickness of the silicidation layer 710, anneal 810 may leave a portion 820 of the silicidation layer 710 remaining over the semiconductive device 200. In other embodiments, the silicidation layer 710 may be fully consumed. The raised layer 510 initially receives the metal during the above-mentioned anneal. Following anneal 810, any portion 820 of the silicidation layer 710 that remains is conventionally removed.

After the removal of any remaining portion 820, of the silicidation layer 710, the semiconductive device 200 is subjected to another anneal 910 that, in one embodiment, is conducted at a temperature ranging from about 450° C. to about 550° C. for about 30 seconds. In one aspect, the anneal 910 forms the silicidation further into the gates 340 and at least partially through the raised layer 510 and, in some embodiments, into the source/drains 415. It should be understood that the anneal 910, in certain embodiments, may not necessarily drive the silicidation layer 710 into the source/drains 415. This will depend on the thickness of the gates 340, the metal used and other process parameters.

During the anneal 910, the gates 340 are substantially silicided; that is, at least as much as 60% of the total volume of the gates 340 will contain a silicide. In another embodiment, however, the gates 340 may be fully silicided where the silicide is located within just a few (3 to 4) atomic layers distance from or right at the gate dielectric 335.

Figure 9:
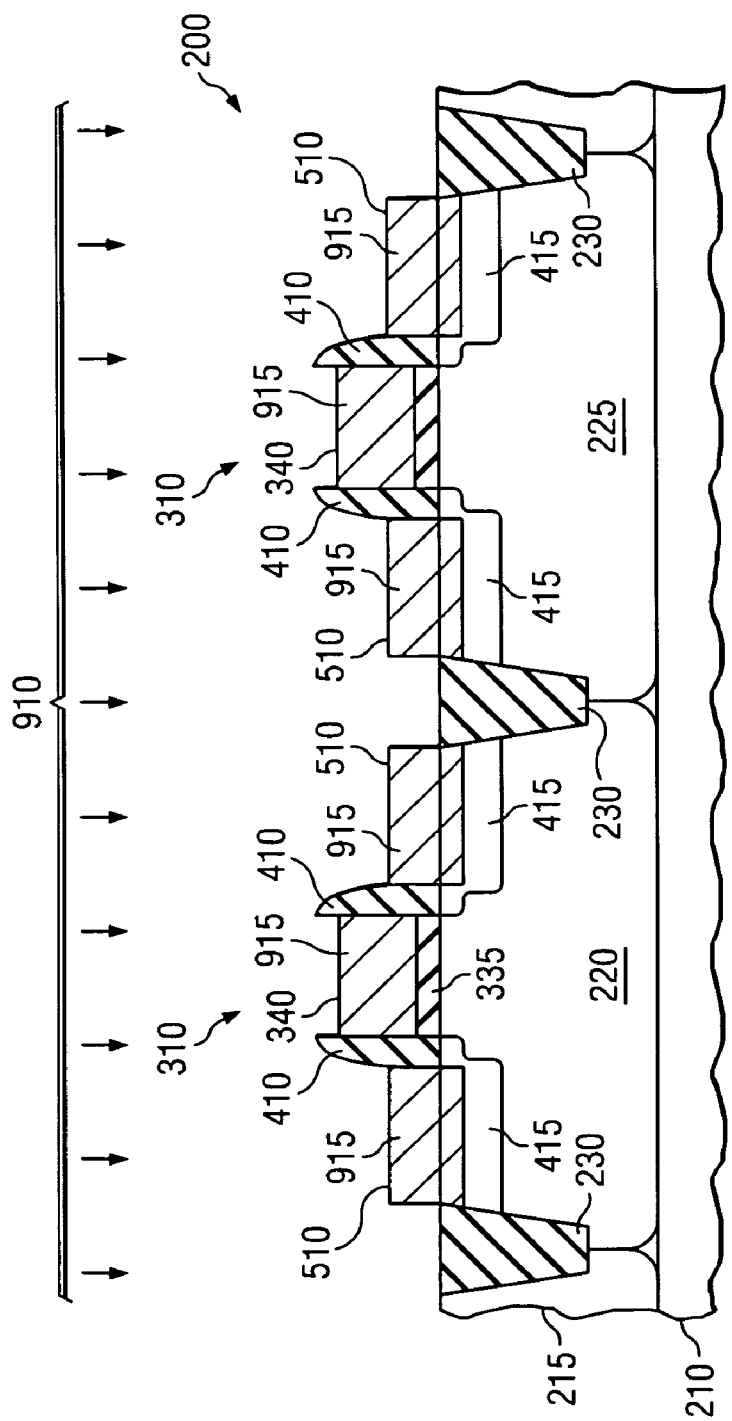
FIG. 9 illustrates a sectional view of the semiconductive device of FIG. 8 following another anneal.

As the anneal 910 forms the silicide further into the gates 340 and the source/drains 415, the metal rich phase 815 transforms to a mono-silicide 915 within the gates 340 and the source/drains 415. As seen in FIG. 9, after silicidation is complete, the silicidation within the source/drains 415 has not penetrated the junction of the source/drains 415 at any point.

Though the above-described embodiments present a process that includes two different anneal steps. It should be understood that other embodiments covered by the invention may involve only one anneal step or more than two anneal steps. In such embodiments, the anneal temperature and time is appropriately adjusted to complete the silicidation of the gates 340 and the source/drains 415, as explained above.

Figure 10:
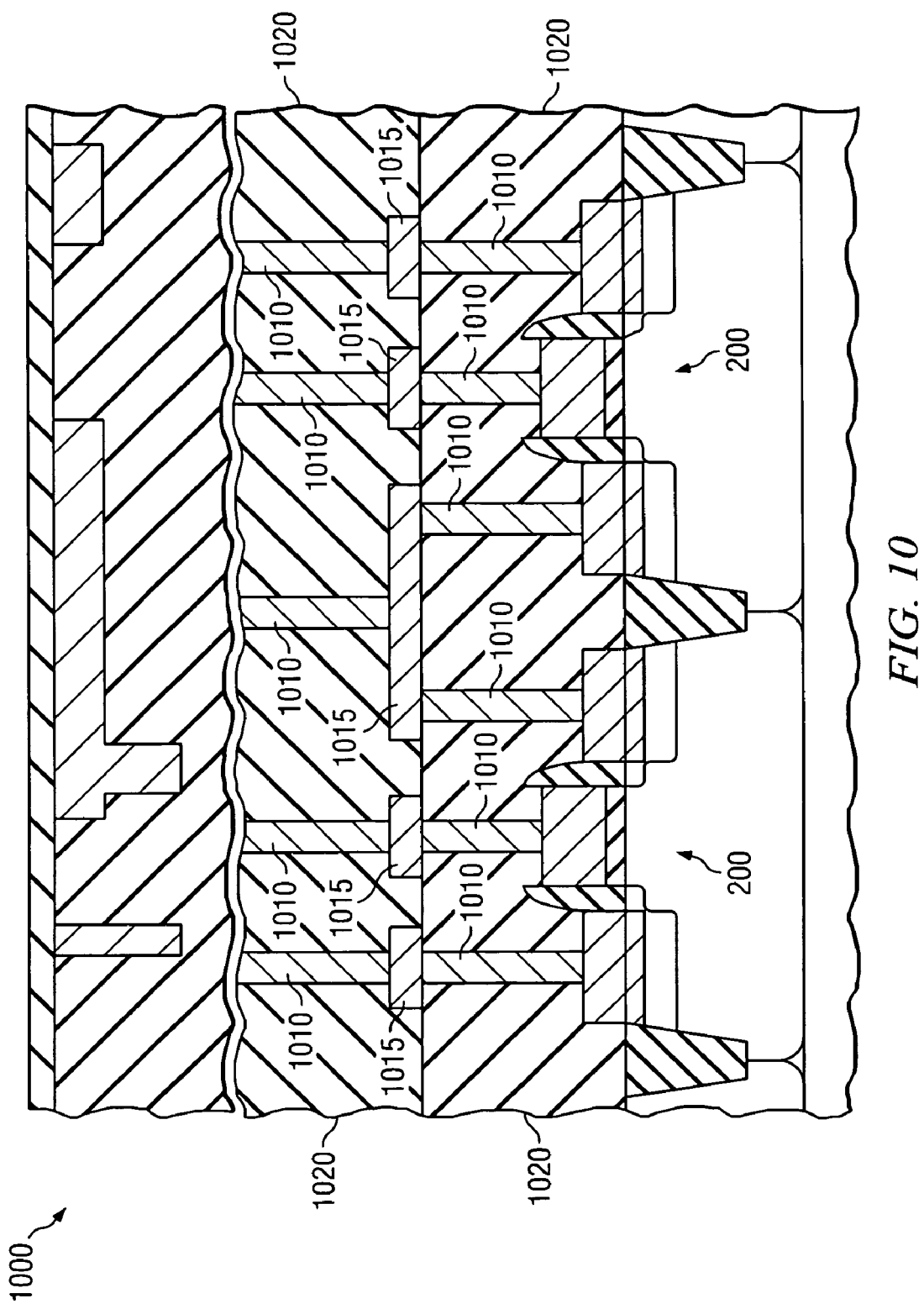
FIG. 10 illustrates a sectional view of an integrated circuit (IC) incorporating the semiconductive device.

FIG. 10 is an integrated circuit (IC) 1000 that incorporates the completed semiconductive device 200 of FIG. 9. The semiconductive device 200 may be configured into a wide variety of devices, such as CMOS devices, BiCMOS devices, Bipolar devices, as well as capacitors or other types of devices. The IC 1000 may further include passive devices, such as inductors or resistors, or it may also include optical devices or optoelectronic devices. Those skilled in the art are familiar with these various types of devices and their manufacture. The semiconductive device 200 includes the various components as discussed above, and conventional interconnect structures 1010 and metal lines 1015 electrically connect the components of the semiconductive device 200 to form an operative IC. The interconnect structures 1110 and metal lines 1015 may be formed in conventional dielectric layers 1020 that are located over the semiconductive device 200. The number of dielectric layers 1020 and metal lines 1015 will vary with design.

From the foregoing, it is seen that the present invention provides a process that is less complex and involves fewer steps that the conventional processes described above. The lessened complexity is at least partially found in the fact that only one metal deposition step is required, which means that fewer masking and removal steps are involved. This reduced complexity results is a more efficient and less costly manufacturing process. Though the raised layer is used in the present invention, it is easily formed by well-known deposition techniques and requires no additional masks since the gates are adequately protected by hardmasks that are blanket deposited and patterned simultaneously with the gate layer. Moreover, the raised layer prevents the silicidation from punching through the source/drain junction and prevents the likelihood of spikes or shorts.

Those skilled in the art to which the invention relates will appreciate that other and further additions, deletions, substitutions, and modifications may be made to the described example embodiments, without departing from the invention.

What is claimed is:

1. A method of fabricating a semiconductive device, comprising:
    forming at least one gate over a semiconductor substrate;
    forming source/drains adjacent the at least one gate and within the semiconductor substrate;
    forming a raised layer adjacent the at least one gate and over the source/drains, wherein a thickness of the raised layer is a function of a thickness of the at least one gate and a depth of the source/drains;
    depositing a silicidation layer over the at least one gate and the raised layer; and
    siliciding the raised layer and at least substantially siliciding the at least one gate with the silicidation layer;
    wherein the thickness of the raised layer is sufficient to prevent silicidation from penetrating a junction of the source/drains at a shallowest doping point of the source/drains when the at least one gate is substantially silicided.

2. The method recited in claim 1, wherein siliciding includes subjecting the silicidation layer to a first temperature and a second temperature greater than the first temperature.

3. The method recited in claim 2, wherein siliciding comprises siliciding the at least one gate and the raised layer at the first temperature and substantially siliciding the at least one gate at the second temperature.

4. The method recited in claim 3, wherein the silicidation layer comprises nickel; the first temperature ranges from about 300° C. to about 450° C.; and the second temperature ranges from about 450° C. to about 550° C.

5. The method recited in claim 4, wherein the silicidation layer is subjected to the first temperature for a period of time ranging from about 30 seconds to about 60 seconds and is subjected to the second temperature for about 30 seconds.

6. The method as recited in claim 4, wherein substantially siliciding the at least one gate at the second temperature includes siliciding the source/drains through the raised layer.

7. The method recited in claim 1, wherein forming the raised layer includes forming an epitaxial layer over the source/drains.

8. The method recited in claim 1, further comprising forming a hardmask on the at least one gate prior to forming the raised layer.

9. The method recited in claim 8, further comprising removing the hardmask subsequent to forming the raised layer and prior to depositing the silicidation layer.

10. The method recited in claim 1, wherein the silicidation layer comprises metal.

11. The method recited in claim 1, wherein siliciding includes simultaneously siliciding the at least one gate and siliciding a portion of the source/drains.

12. The method recited in claim 1, wherein the thickness of the raised layer is about 25% to about 50% of the thickness of the at least one gate.

13. A method of manufacturing a semiconductive device, comprising:
    forming gates with a hardmask located thereover over a semiconductive substrate;
    forming source/drains adjacent the gates;
    forming raised layers adjacent the gates and over the source/drains, wherein a thickness of the raised layers is a function of a thickness of the gates and a depth of the source/drains;
    removing the hardmask from each of the gates;
    depositing a silicidation layer over the gates and the raised layers; and
    siliciding the raised layers and at least substantially siliciding the gates with the silicidation layer;
    wherein the thickness of the raised layers is sufficient to prevent silicidation from penetrating a junction of the source/drains at a shallowest doping point of the source/drains when the gates are substantially silicided.

14. The method recited in claim 13, wherein siliciding the gates includes moving at least a portion of the silicidation layer into the gates and the raised layers by subjecting the silicidation layer to a first temperature that forms a metal rich version of the silicide.

15. The method recited in claim 14, wherein moving at least a portion of the silicidation layer into the gates and the raised layers further includes subjecting the silicidation layer to a second temperature greater than the first temperature to diffuse the metal further to a desired depth as a mono-silicide in the source/drains.

16. The method recited in claim 15, wherein the silicidation layer comprises nickel; the first temperature ranges from about 300° C. to about 450° C.; and the second temperature ranges from about 450° C. to about 550° C.; and wherein the silicidation layer is subjected to the first temperature for a period of time ranging from about 30 seconds to about 60 seconds and to the second temperature for about 30seconds.

17. The method recited in claim 13, wherein forming the raised layers includes forming epitaxial layers over the source/drains.

18. The method recited in claim 13, further comprising forming dielectric layers over the gates and forming interconnect structures in the dielectrics layers to electrically connect the gates and form an operative integrated circuit.

* * * * *